US010559342B2

(12) United States Patent
Fujioka et al.

(10) Patent No.: US 10,559,342 B2
(45) Date of Patent: Feb. 11, 2020

(54) DYNAMIC RANDOM ACCESS MEMORY WITH REDUCED POWER CONSUMPTION

(71) Applicant: Winbond Electronics Corp., Taichung (TW)

(72) Inventors: Shinya Fujioka, Kanagawa (JP); Hitoshi Ikeda, Kanagawa (JP)

(73) Assignee: Windbond Electronics Corp., Taichung (TW)

( * ) Notice: Subject to any disclaimer, the term of this patent is extended or adjusted under 35 U.S.C. 154(b) by 0 days.

(21) Appl. No.: 16/111,227

(22) Filed: Aug. 24, 2018

(65) Prior Publication Data

US 2019/0385668 A1    Dec. 19, 2019

(30) Foreign Application Priority Data

Jun. 14, 2018   (JP) .................................. 2018-113611

(51) Int. Cl.
*G11C 11/406*   (2006.01)
*G11C 11/4074*  (2006.01)
*G11C 11/4091*  (2006.01)

(52) U.S. Cl.
CPC .... *G11C 11/40615* (2013.01); *G11C 11/4074* (2013.01); *G11C 11/4091* (2013.01); *G11C 11/40626* (2013.01)

(58) Field of Classification Search
CPC ........ G11C 11/40615; G11C 11/40626; G11C 11/4074; G11C 11/4091
See application file for complete search history.

(56) References Cited

U.S. PATENT DOCUMENTS 4,710,903 A    12/1987   Hereth et al.
5,532,968 A    7/1996    Lee
(Continued)

FOREIGN PATENT DOCUMENTS

CN   103000223   3/2016
JP   2003068075  3/2003
(Continued)

OTHER PUBLICATIONS

"Office Action of Taiwan Counterpart Application," dated Jan. 4, 2019, p. 1-p. 6.
(Continued)

*Primary Examiner* — Gene N Auduong
(74) *Attorney, Agent, or Firm* — JCIPRNET (57) ABSTRACT

A dynamic random access memory (DRAM) and an operation method thereof are provided. The DRAM includes a temperature sensor, a dynamic memory cell array, a control circuit, a plurality of power supply circuits and a power control circuit. The temperature sensor senses an operating temperature of the DRAM. The control circuit is coupled to a dynamic memory cell array, and accesses and manages the dynamic memory cell array. The power supply circuits powers the dynamic memory cell array and the control circuit. The power control circuit controls power outputs of the power supply circuits. When the DRAM enters the self-refresh mode, the power control circuit selectively switches between a low power control state and a normal power control state according to the operating temperature of the DRAM.

10 Claims, 5 Drawing Sheets

(56) References Cited

U.S. PATENT DOCUMENTS

| | | | |
|---|---|---|---|
| 7,035,157 B2* | 4/2006 | Chang | G11C 11/406 |
| | | | 365/211 |
| 9,959,921 B2* | 5/2018 | Ishikawa | G11C 11/40615 |
| 2005/0104566 A1 | 5/2005 | Kim | |
| 2005/0105367 A1 | 5/2005 | Kim et al. | |
| 2005/0174164 A1 | 8/2005 | Fuhrmann et al. | |
| 2005/0201174 A1 | 9/2005 | Klein | |
| 2006/0236027 A1* | 10/2006 | Jain | G11C 7/04 |
| | | | 711/106 |
| 2010/0110818 A1 | 5/2010 | Mori et al. | |
| 2010/0253317 A1 | 10/2010 | Okuno et al. | |
| 2014/0095740 A1* | 4/2014 | Ozawa | G06F 11/3034 |
| | | | 710/18 |

FOREIGN PATENT DOCUMENTS

| | | |
|---|---|---|
| JP | 2010244616 | 10/2010 |
| TW | I320184 | 2/2010 |
| TW | 201346926 | 11/2013 |
| TW | 201743328 | 12/2017 |
| TW | 201820329 | 6/2018 |
| WO | 2009008081 | 1/2009 |

OTHER PUBLICATIONS

"Office Action of Japan Counterpart Application," dated Aug. 20, 2019, p. 1-p. 5.

* cited by examiner

DYNAMIC RANDOM ACCESS MEMORY WITH REDUCED POWER CONSUMPTION

CROSS-REFERENCE TO RELATED APPLICATION

This application claims the priority benefit of Japan application serial no. 2018-113611, filed on Jun. 14, 2018. The entirety of the above-mentioned patent application is hereby incorporated by reference herein and made a part of this specification.

BACKGROUND OF THE INVENTION

Field of the Invention

The invention relates to a memory, and particularly relates to a dynamic random access memory (DRAM).

Description of Related Art

Recently, a product of Narrow Band Internet of Things (NB-IoT, for example, a wearable device, a mobile device, etc.) requires a low-power memory with about megabits of memory capacity. Therefore, the low-power Dynamic Random Access Memory (DRAM) such as a pseudo-Static Random Access Memory (pSRAM) is widely applied to the NB-IoT. However, a current consumed by such type of memory in a self-refresh mode cannot be ignored.

SUMMARY OF THE INVENTION

The invention is directed to a Dynamic Random Access Memory (DRAM), which is adapted to further decrease a power of the DRAM in a self-refresh mode.

An embodiment of the invention provides a DRAM. The DRAM includes a temperature sensor, a dynamic memory cell array, a control circuit, a plurality of power supply circuits and a power control circuit. The temperature sensor senses an operating temperature of the DRAM. The control circuit is coupled to the dynamic memory cell array, and accesses and manages the dynamic memory cell array. The power supply circuits supply power to the dynamic memory cell array and the control circuit. The power control circuit controls power outputs of the power supply circuits. When the DRAM enters a self-refresh mode, the power control circuit selectively switches between a low power control state and a normal power control state according to the operating temperature of the DRAM.

An embodiment of the invention provides a DRAM. The DRAM includes a dynamic memory cell array, a control circuit, a plurality of power supply circuits and a power control circuit. The control circuit is coupled to the dynamic memory cell array, and accesses and manages the dynamic memory cell array. The power supply circuits supply a proper driving voltage to the dynamic memory cell array and the control circuit. The power supply circuits are divided into a plurality of groups, where the groups include a first group. The power control circuit controls power outputs of the power supply circuits. When the DRAM enters a self-refresh mode, the power control circuit selectively switches between a low power control state and a normal power control state. When the power control circuit is operated in the low power control state, and during an internal self-refresh command sending period, the power control circuit controls the power outputs of the power supply circuits of the first group to switch from a floating state to an active state. When the power control circuit is operated in the low power control state, and after the internal self-refresh command sending period is ended, the power control circuit controls the power outputs of the power supply circuits of the first group to switch back from the active state to the floating state.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

In a DRAM of the embodiments of the invention, a temperature sensor is adopted to sense an operating temperature. When the DRAM enters a self-refresh mode, the power control circuit may selectively switch between a low power control state and a normal power control state according to the operating temperature of the DRAM. In this way, the DRAM of the embodiments of the invention may further manage a power of the DRAM in the self-refresh mode, so as to reduce a current consumed by the DRAM in the self-refresh mode. Regarding an IoT sensor node (for example, a wearable device and a mobile device), since a longer battery operating time is achieved, the characteristic thereof is more attractive.

Regarding a semiconductor memory with the self-refresh mode, the self-refresh mode is enabled by an external command sent by a memory controller in a microcontroller or a System-on-a-Chip (SoC). After the self-refresh mode is entered, the power control circuit may detect an operating temperature of the semiconductor memory through a temperature sensor. According to the operating temperature, the temperature sensor may further manage a power of the semiconductor memory. Therefore, the semiconductor memory may achieve the optimal power consumption in the self-refresh mode.

An example of taking a pseudo-Static Random Access Memory (pSRAM) as a DRAM is introduced below. It should be noted that in the following embodiment although the pSRAM is taken as an example for description, related descriptions of the following embodiments may also be applied to other types of the DRAM with the self-refresh mode.

Figure 1:
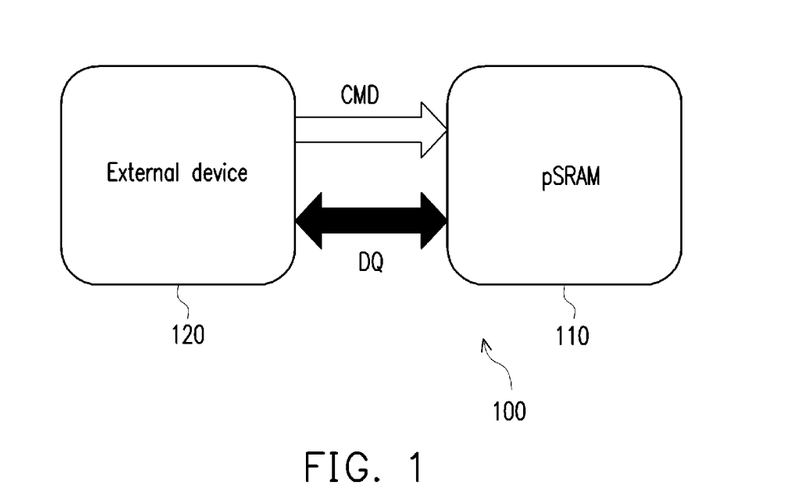
FIG. 1 is a circuit block diagram of an electronic system taking a DRAM as a main memory thereof according to an embodiment of the invention.

FIG. 1 is a circuit block diagram of an electronic system 100 taking a DRAM as a main memory thereof according to an embodiment of the invention. The embodiment of FIG. 1 is an example of taking a pSRAM 110 as a DRAM. Related descriptions of the embodiment of FIG. 1 may also be applied to other types of DRAM. The pSRAM 110 is connected to an external device 120 through a pin CMD and a pin DQ. According to a design requirement, the external device 120 may be a MCU, a SoC or other operating circuit/component. A memory controller (not shown) in the external device 120 may send an external command (for example, an access command, a managing command, etc.) to the pSRAM 110. For example, the external device 120 may send the external command to the pSRAM 110 according to a system transaction. The pSRAM 110 executes a corresponding operation according to each external command.

Figure 2:
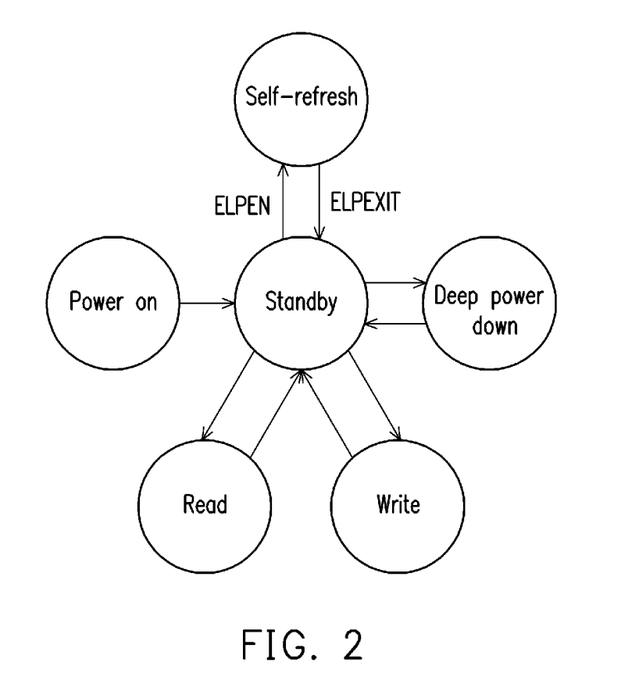
FIG. 2 is a schematic diagram of an operating mode of a pSRAM shown in FIG. 1 according to an embodiment of the invention.

FIG. 2 is a schematic diagram of an operating mode of the pSRAM 110 shown in FIG. 1 according to an embodiment of the invention. After power on, the pSRAM 110 enters a standby mode. Under the standby mode, the pSRAM 110 may receive an external command from the external device 120, and execute a corresponding operating mode according to the external command. For example, when the pSRAM 110 receives a read command from the external device 120, the pSRAM 110 may enter a read mode from the standby mode. After the read command is completed, the pSRAM 110 may return to the standby mode from the read mode. When the pSRAM 110 receives a write command from the external device 120, the pSRAM 110 may enter a write mode from the standby mode. After the write command is completed, the pSRAM 110 may return to the standby mode from the write mode. When the pSRAM 110 receives a deep power down command from the external device 120, the pSRAM 110 may enter a deep power down mode from the standby mode. When the pSRAM 110 receives a wakeup command from the external device 120, the pSRAM 110 may return to the standby mode from the deep power down mode.

Based on management on a dynamic memory cell array in the pSRAM 110, a control circuit in the pSRAM 110 may send a self-refresh entry command ELPEN and a self-refresh exit command ELPEXIT at a proper time. When the control circuit in the pSRAM 110 sends the self-refresh entry command ELPEN, the pSRAM 110 may enter a self-refresh mode from the standby mode. When the control circuit in the pSRAM 110 sends a self-refresh exit command ELPEXIT, the pSRAM 110 may return to the standby mode from the self-refresh mode.

Alternatively, the external device 120 may request the pSRAM 110 to enter the self-refresh mode based on management on the dynamic memory cell array in the pSRAM 110. After the entry request is received from the external device 120, the internal of the pSRAM 110 correspondingly generates the self-refresh entry command ELPEN. The self-refresh entry command ELPEN makes the related circuit in the pSRAM 110 to enter the self-refresh mode. When the pSRAM 110 receives an exit request from the external device 120, the internal of the pSRAM 110 correspondingly generates the self-refresh exit command ELPEXIT, and the pSRAM 110 returns to the standby mode.

Figure 3:
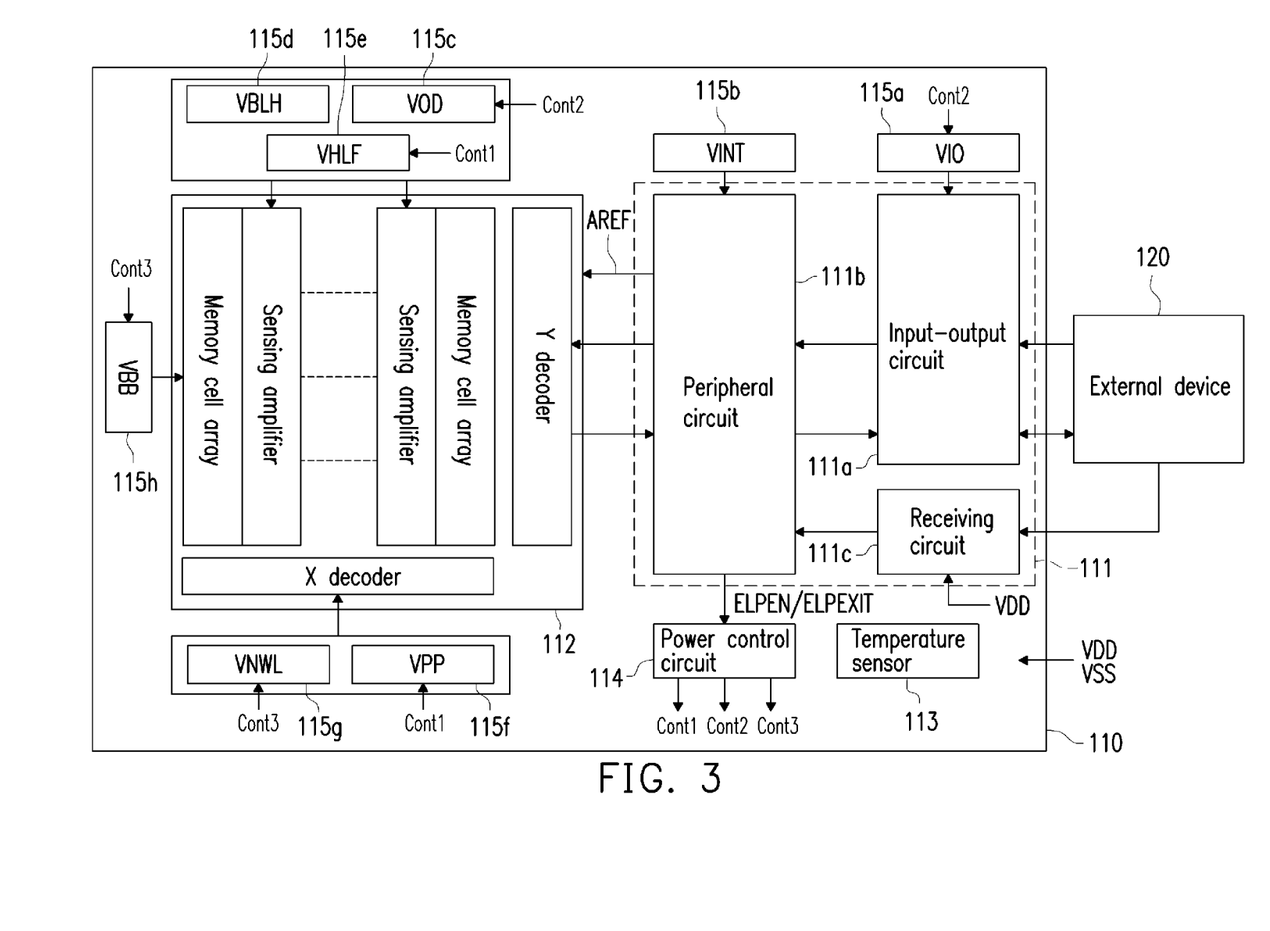
FIG. 3 is a circuit block diagram of the pSRAM shown in FIG. 1 according to an embodiment of the invention.

FIG. 3 is a circuit block diagram of the pSRAM 110 shown in FIG. 1 according to an embodiment of the invention. The pSRAM 110 of FIG. 3 includes a control circuit 111, a dynamic memory cell array 112, a temperature sensor 113, a power control circuit 114 and a plurality of power supply circuits. The power control circuit 114 may control power output of the power supply circuits, and the power supply circuits may supply power to the dynamic memory cell array 112 and the control circuit 111. In the embodiment of FIG. 3, the power supply circuits include an input-output power supply circuit 115a, a peripheral power supply circuit 115b, a sensing amplifier power supply circuit 115c, a sensing amplifier power supply circuit 115d, a sensing amplifier power supply circuit 115e, a memory cell power supply circuit 115f, a memory cell power supply circuit 115g and a memory cell power supply circuit 115h.

The control circuit 111 is coupled to the dynamic memory cell array 112. The control circuit 111 may access and manage the dynamic memory cell array 112. The dynamic memory cell array 112 may include memory cell arrays, sensing amplifiers, an X decoder and a Y decoder. The temperature sensor 113 senses an operating temperature of the pSRAM 110. In some embodiments, the dynamic memory cell array 112 may be a conventional dynamic memory cell array, and detail thereof is not repeated.

When the external device 120 requests the pSRAM 110 to enter the self-refresh mode, the control circuit 111 may determine to operate the pSRAM 110 in a normal power control state or a low power control state according to an operating temperature of the pSRAM 110. For example, if the operating temperature of the pSRAM 110 is higher than a threshold temperature, the control circuit 111 first operates the pSRAM 110 in the normal power control state. The threshold temperature may be determined according to an actual design requirement. Once the operating temperature of the pSRAM 110 is lower than the threshold temperature, the control circuit 111 operates the pSRAM 110 in the low power control state, so as to reduce power consumption.

After the pSRAM 110 enters the self-refresh mode, and before the external device 120 requests the pSRAM 110 to exit the self-refresh mode, the control circuit 111 may selectively switch the pSRAM 110 between the normal power control state and the low power control state according to the operating temperature of the pSRAM 110. For example, after the pSRAM 110 enters the self-refresh mode, when the pSRAM 110 is operated in the normal power control state, if the operating temperature of the pSRAM 110 is sensed to be lower than the threshold temperature, the control circuit 111 switches the pSRAM 110 to the low power control state; similarly, when the pSRAM 110 is operated in the low power control state, if the operating temperature of the pSRAM 110 is sensed to be higher than the threshold temperature, the control circuit 111 switches the pSRAM 110 to the normal power control state.

When the external device 120 requests the pSRAM 110 to exit the self-refresh mode, the control circuit 111 first controls the pSRAM 110 to operate in the normal power control state, and then controls the pSRAM 110 to return to the standby mode. To be specific, when the external device 120 requests the pSRAM 110 to exit the self-refresh mode, if the pSRAM 110 is operated in the normal power control state, the pSRAM 110 may immediately return to the standby mode. However, if the pSRAM 110 is operated in the low power control state, the control circuit 111 may first control the pSRAM 110 to switch to the normal power control state, and then control the pSRAM 110 to return to the standby mode.

The pSRAM 110 receives an external command from the external device 120. In the embodiment of FIG. 3, the control circuit 111 includes an input-output circuit 111*a*, a peripheral circuit 111*b* and a receiving circuit 111*c*. The peripheral circuit 111*b* is coupled between the input-output circuit 111*a* and the dynamic memory cell array 112, and coupled between the receiving circuit 111*c* and the dynamic memory cell array 112. The input-output power supply circuit 115*a* may supply power to the input-output circuit 111*a*. The system voltage VDD may supply power to the receiving circuit 111*c*. Under the low power control state, the system voltage VDD may continually supply power (activate) the receiving circuit 111*c*. Therefore, the receiving circuit 111*c* may serve as a receiver in a low power mode. When the power control circuit 114 is operated in the low power control state, the power output of the input-output power supply circuit 115*a* is maintained to a floating state (stops providing a voltage VIO). When the power control circuit 114 is operated in the normal power control state, the power output of the input-output power supply circuit 115*a* is switched to an active state (restores providing the voltage VIO to the input-output circuit 111*a*) from the floating state. The peripheral power supply circuit 115*b* supplies power to the peripheral circuit 111*b*. When the power control circuit 114 is operated in the low power control state and the normal power control state, the power outputs of the peripheral power supply circuit 115*b* are all maintained to the active state (continually supply a voltage VINT to the peripheral circuit 111*b*).

The input-output circuit 111*a* may provide an access interface to the external device 120. The input-output circuit 111*a* may cache the external command of the external device 120, and transmit the external command to the peripheral circuit 111*b*. In the peripheral circuit 111*b*, such external command is decoded to make the pSRAM 110 to enter a corresponding mode (as shown in FIG. 2). The peripheral circuit 111*b* sends at least one internal command to manage the power control circuit 114 and other circuits. The at least one internal command includes an internal self-refresh command AREF, a self-refresh entry command ELPEN or a self-refresh exit command ELPEXIT. When the external command requests to enter the self-refresh mode, the peripheral circuit 111*b* may correspondingly control the power control circuit 114 to further manage the power of the pSRAM 110 in the self-refresh mode.

Figure 4:
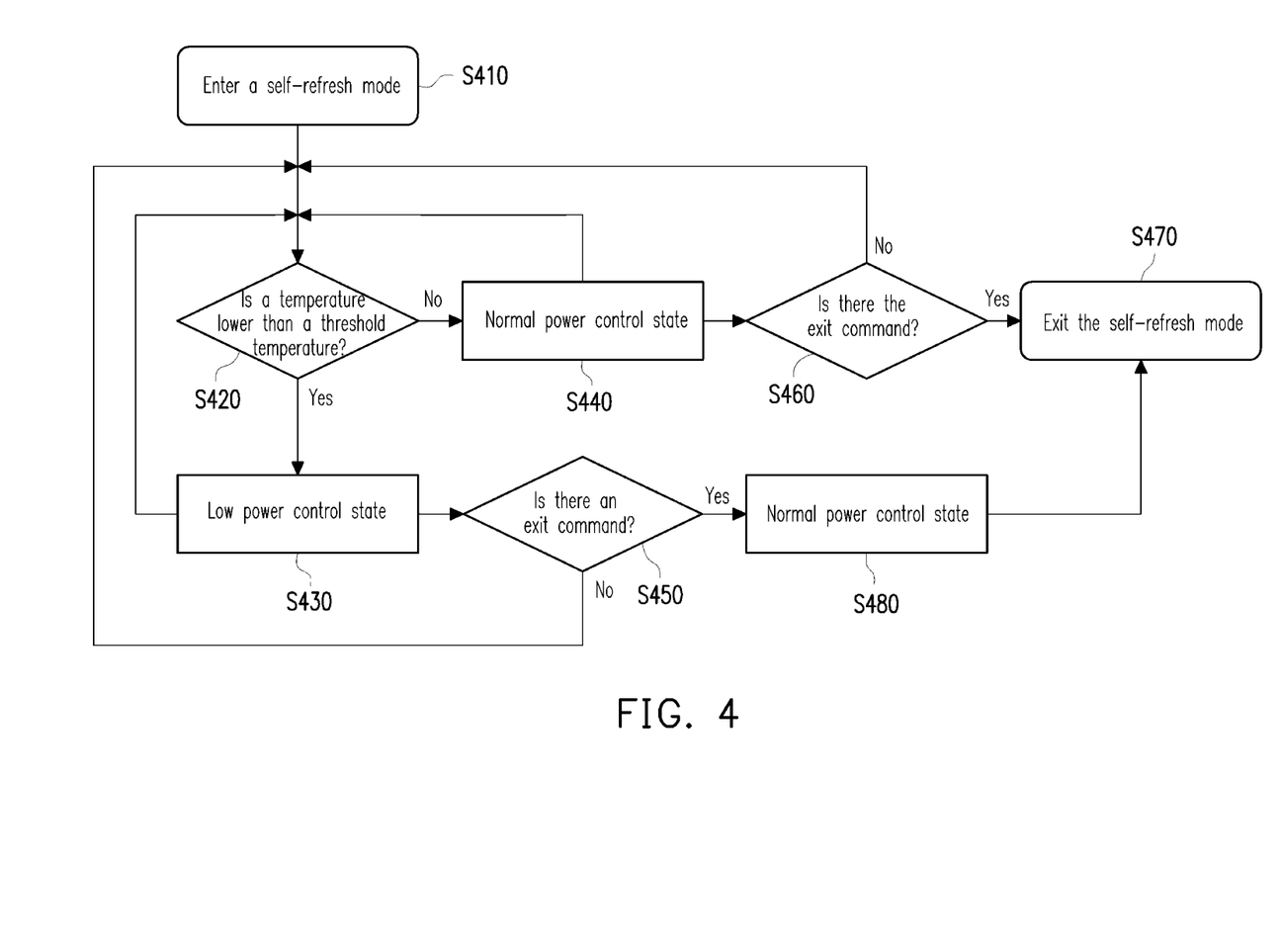
FIG. 4 is a flowchart illustrating an operation method of the pSRAM according to an embodiment of the invention.

FIG. 4 is a flowchart illustrating an operation method of the pSRAM 110 according to an embodiment of the invention. Under the standby mode, after the pSRAM 110 receives an instruction of entering the self-refresh mode from the external device 120, the power control circuit 114 may detect an operating temperature of the pSRAM 110 through the temperature sensor 113, and determine a power control state according to the operating temperature of the pSRAM 110. When the pSRAM 110 enters the self-refresh mode (a step S410), the power control circuit 114 may selectively switch between a low power control state (a step S430) and a normal power control state (a step S440) according to the operating temperature of the pSRAM 110.

For example, in case that the pSRAM 110 is in the self-refresh mode, when it is determined that the operating temperature of the pSRAM 110 is lower than a threshold temperature in a step S420, the power control circuit 114 is operated in the low power control state (the step S430). In case that the power control circuit 114 is operated in the low power control state, the power control circuit 114 may continually detect the operating temperature of the pSRAM 110 (the step S420), and determines whether to leave the low power control state to enter the normal power control state according to the operating temperature of the pSRAM 110 (the step S440). When it is determined that the operating temperature of the pSRAM 110 is higher than the threshold temperature in the step S420, the power control circuit 114 is operated in the normal power control state (the step S440).

In case that the power control circuit 114 is operated in the normal power control state, the power control circuit 114 may continually detect the operating temperature of the pSRAM 110 (the step S420), and determine whether to leave the normal power control state (the step S440) to enter the low power control state (the step S430) according to the operating temperature of the pSRAM 110. In the step S420, when it is determined that the operating temperature of the pSRAM 110 is lower than the threshold temperature, the power control circuit 114 is operated in the low power control state (the step S430).

Namely, regardless of whether the pSRAM 110 is operated in the low power control state (the step S430) or the normal power control state (the step S440), the pSRAM 110 may continually use the temperature sensor 113 to detect the operating temperature of the pSRAM 110, and determine whether to switch the pSRAM 110 to the normal power control state (the step S440) or the low power control state (the step S430).

Under the normal power control state (the step S440) and the low power control state (the step S430), the control circuit 111 may wait for an exit command received from the external device 120 (a step S450 and a step S460). When the external device 120 requests the pSRAM 110 to leave the self-refresh mode, the pSRAM 110 first detect the power control state. When the pSRAM 110 is in the general power control state (the step S440), if the pSRAM 110 receives the exit command from the external device 120 ("yes" in the step S460), the pSRAM 110 may directly exit the self-refresh mode and return to the standby mode (a step S470). Under the low power control state (the step S430), if the pSRAM 110 receives the exit command from the external device 120 ("yes" in the step S460), the power control circuit 114 may first leave the low power control state (the step S43) to enter the normal power control state (the step S480), and after entering the normal power control state, the pSRAM 110 automatically exits the self-refresh mode and turns to the standby mode (step S470).

According to a design requirement, the power supply circuits of the pSRAM 110 may be divided into a plurality of groups. For example, in the embodiment shown in FIG. 3, the sensing amplifier power supply circuit 115*e* used for providing a voltage VHLF and the memory cell power supply circuit 115*f* used for providing a voltage VPP belong to a first group; the input-output power supply circuit 115*a* used for providing the voltage VIO and the sensing amplifier power supply circuit 115c used for providing a voltage VOD belong to a second group; the memory cell power supply circuit 115g used for providing a voltage VNWL and the memory cell power supply circuit 115h used for providing a voltage VBB belong to a third group; and the peripheral power supply circuit 115b used for providing a voltage VINT and the sensing amplifier power supply circuit 115d used for providing a voltage VBLH belong to a fourth group. The power control circuit 114 controls the power supply circuits belonging to the first group through a control signal Cont1, controls the power supply circuits belonging to the second group through a control signal Cont2, and controls the power supply circuits belonging to the third group through a control signal Cont3. A following table 1 lists control strategies of the grouped power supply circuits operated in the normal power control state and the low power control state.

TABLE 1 control table of power supply circuits

| Group | Direct current voltage | | Normal power control state | Low power control state |
|---|---|---|---|---|
| 1 | VPP | Array control | VPP | VPP or floating |
| 2 | VOD | Array control | VOD | Floating |
| 4 | VINT | Peripheral control | VINT | VINT |
| 2 | VIO | Input-output control | VINT | Floating |
| 4 | VBLH | Array control | VBLH | VBLH |
| 1 | VHLF | Array control | VHLF | VHLF or floating |
| 3 | VNWL | Array control | VNWL | VSS |
| 3 | VBB | Array control | VBB | VSS |

In table 1, the voltage VPP and the voltage VNWL are used for controlling memory cells in the dynamic memory cell array 112. The voltage VPP is used for opening the memory cells, and the voltage VNWL is used for closing the memory cells.

The voltage VOD, the voltage VBLH and the voltage VHLF are used for managing and controlling the sensing amplifiers in the dynamic memory cell array 112. The voltage VOD and the voltage VBLH are used for maintaining a high logic level of data. The voltage VHLF may clamp a bit line voltage to VBLH/2 under the standby state, which means that when the pSRAM 110 is in the standby mode, the bit line voltage is required to be set to ½ of VBLH. In other words, VHLF=VBLH/2. The voltage VINT is used for managing the peripheral circuit 111b, and the voltage VIO is used for managing the input-output circuit 111a. The voltage VBB is used for providing a back bias level of the memory cells in the dynamic memory cell array 112. The levels of the voltages mentioned in FIG. 3 and the table 1 may be determined according to an actual design requirement. For example (but not limited to), VPP=2.85 V, VOD=1.8 V, VINT=1.1 V, VIO=1.1 V, VBLH=1.1 V, VHLF=0.55 V, VNWL=−0.15 V, VBB=−0.5 V. VDD=1.8 V and VSS=0 V.

According to related description of FIG. 4, based on a detection result of the operating temperature of the temperature sensor 113, the power control circuit 114 may be selectively switched between the low power control state and the normal power control state. In the normal power control state, the power control circuit 114 may activate the input-output power supply circuit 115a, the sensing amplifier power supply circuit 115c, the sensing amplifier power supply circuit 115e, the memory cell power supply circuit 115f, the memory cell power supply circuit 115g and the memory cell power supply circuit 115h. In the active state, the input-output power supply circuit 115a provides the voltage VIO (the level of the voltage VIO is the same with that of the voltage VINT), the peripheral power supply circuit 115b provides the voltage VINT, the sensing amplifier power supply circuit 115c provides the voltage VOD, the sensing amplifier power supply circuit 115d provides the voltage VBLH, the sensing amplifier power supply circuit 115e provides the voltage VHLF, the memory cell power supply circuit 115f provides the voltage VPP, the memory cell power supply circuit 115g provides the voltage VNWL, and the memory cell power supply circuit 115h provides the voltage VBB.

Figure 5A:
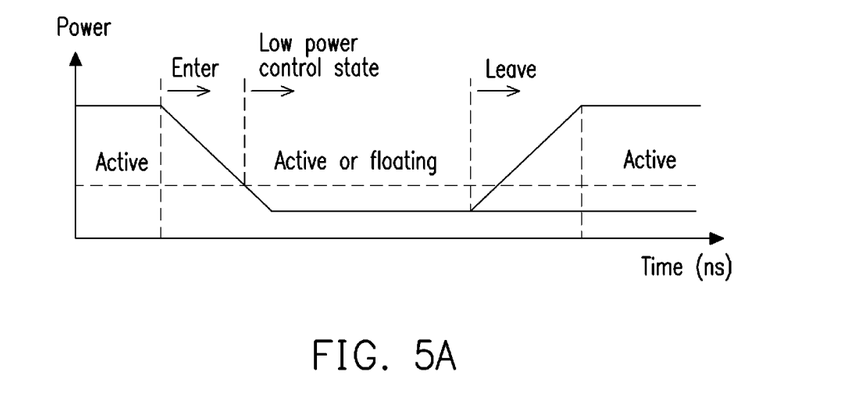
FIG. 5A is a power schematic diagram of power supply circuits belonging to a first group according to an embodiment of the invention.

FIG. 5A is a power schematic diagram of the power supply circuits belonging to the first group according to an embodiment of the invention. In FIG. 5A, a horizontal axis represents time, and a vertical axis represents power. When the power control circuit 114 is operated in the normal power control state, the power control circuit 114 maintains the power outputs of the power supply circuits belonging to the first group to the active state. Based on the related description of FIG. 4, the power control circuit 114 may switch the power supply circuits belonging to the first group from the normal power control state (the active state) to the low power control state. In the low power controls state, the power outputs of the power supply circuits belonging to the first group may be operated in the floating state or active state according to the internal self-refresh command AREF. Therefore, the power control circuit 114 may further manage the power of the power supply circuits belonging to the first group in the self-refresh mode, so as to decrease the power of the power supply circuits (as shown in FIG. 5A).

Figure 5B:
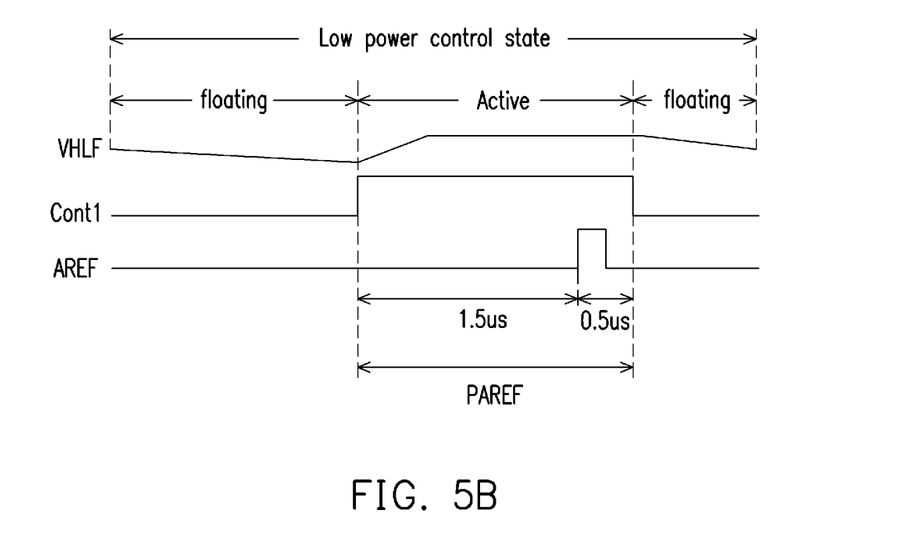
FIG. 5B is a waveform diagram of a voltage VHLF of FIG. 3 in a low power control state according to an embodiment of the invention.

FIG. 5B is a waveform diagram of the voltage VHLF of the sensing amplifier power supply circuit 115e of FIG. 3 in the low power control state according to an embodiment of the invention. The other power supply circuits belonging to the first group (for example, the memory cell power supply circuit 115f) may be deduced by referring to the related description of the sensing amplifier power supply circuit 115e, and detail thereof is not repeated. In FIG. 5B, a horizontal axis represents time, and a vertical axis represents the voltage level. In the low power control state, the power output of the sensing amplifier power supply circuit 115e is generally maintained to the floating state (besides an internal self-refresh command sending period PAREF). A time length of the internal self-refresh command sending period PAREF may be determined according to an actual design requirement. For example, in the exemplary embodiment of FIG. 5B, a period from 1.5 us before the internal self-refresh command AREF to 0.5 μs after the internal self-refresh command AREF is defined as the internal self-refresh command sending period PAREF. In the internal self-refresh command sending period PAREF, the power control circuit 114 may control the sensing amplifier power supply circuit 115e through the control signal Cont1. Based on the control signal Cont1, the power output of the sensing amplifier power supply circuit 115e may be switched from the floating state to the active state during the internal self-refresh command sending period PAREF, and the dynamic memory cell array 112 of the PSRAM 110 performs a self-refresh operation. Since current consumption and current leakage of a self-refresh circuit are relatively large, after the self-refresh operation is ended, the self-refresh circuit is managed to stop operation (i.e. the power output of the power supply of the self-refresh circuit is changed to floating after the self-refresh operation is completed). Therefore, after the internal self-refresh command sending period PAREF is ended, the power control circuit 114 controls the power output of the sensing amplifier power supply circuit 115e to switch from the active state to the floating state through the control signal Cont1. Therefore, the power control circuit 114 may further manage the power of the sensing amplifier power supply circuit 115e in the self-refresh mode, so as to reduce the power of the sensing amplifier power supply circuit 115e.

Figure 6:
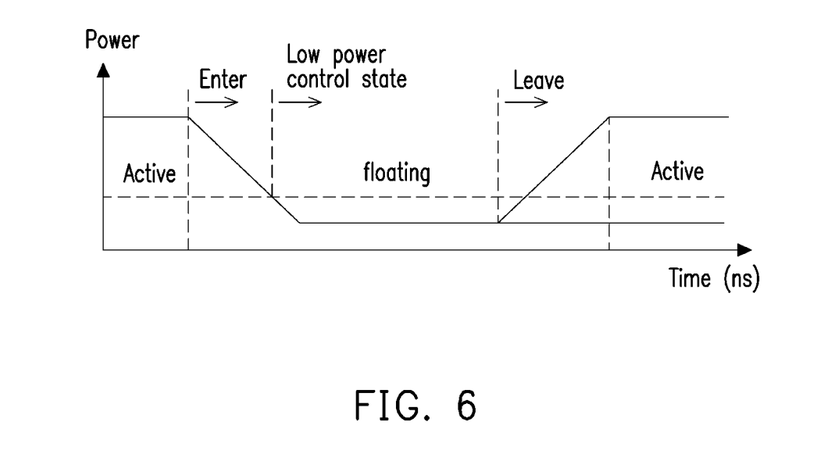
FIG. 6 is a power schematic diagram of power supply circuits belonging to a second group according to an embodiment of the invention.

FIG. 6 is a power schematic diagram of the power supply circuits belonging to the second group according to an embodiment of the invention. In FIG. 6, a horizontal axis represents time, and a vertical axis represents power. When the power control circuit 114 is operated in the normal power control state, the power control circuit 114 maintains the power outputs of the power supply circuits belonging to the second group to the active state. Under the self-refresh mode, the power outputs of the power supply circuits belonging to the second group are not necessary. According to related description of FIG. 4, the power control circuit 114 may switch the power supply circuits belonging to the second group from the normal power control state (the active state) to the low power control state. In the low power control state, the power outputs of the power supply circuits belonging to the second group may operate in the floating state, so as to reduce the current leakage. When the power control circuit 114 is operated in the normal power control state, the power control circuit 114 controls the power outputs of the power supply circuits belonging to the second group to switch from the floating state to the active state. Therefore, the power control circuit 114 may further manage the power of the power supply circuits belonging to the second group in the self-refresh mode, so as to reduce the power of the power supply circuits (as shown in FIG. 6).

Figure 7:
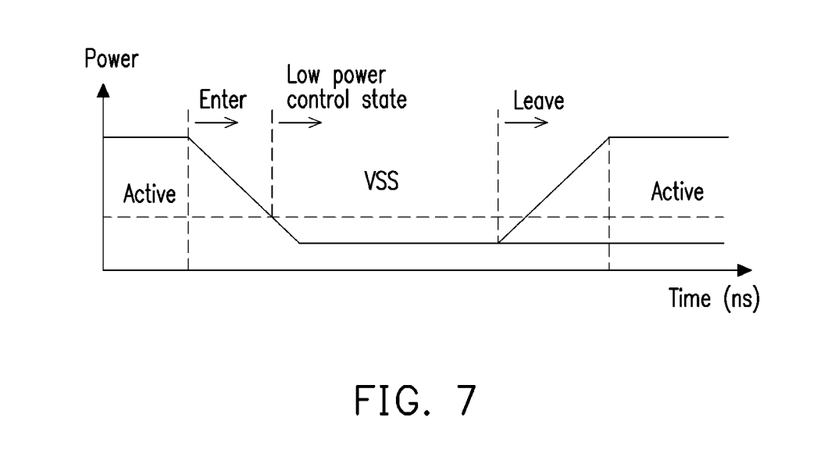
FIG. 7 is a power schematic diagram of power supply circuits belonging to a third group according to an embodiment of the invention.

FIG. 7 is a power schematic diagram of the power supply circuits belonging to the third group according to an embodiment of the invention. In FIG. 7, a horizontal axis represents time, and a vertical axis represents power. When the power control circuit 114 is operated in the normal power control state, the power control circuit 114 maintains the power outputs of the power supply circuits belonging to the third group to the active state. According to related description of FIG. 4, the power control circuit 114 may switch the power supply circuits belonging to the third group from the normal power control state (the active state) to the low power control state. In the low power control state, the power outputs of the power supply circuits belonging to the third group may be clamped to a ground voltage VSS. For example, the voltage VBB and the voltage VNWL are used for maintaining memory cell data in a high temperature, and are not used under a room temperature. Therefore, if the operating temperature of the pSRAM 110 is lower than the threshold temperature, the voltage VBB and the voltage VNWL may be clamped to the ground voltage VSS. When the power control circuit 114 is operated in the normal power control state, the power control circuit 114 controls the power output of the power supply circuits belonging to the third group to restore the active state, as shown in the table 1. Therefore, the power control circuit 114 may further manage the power of the power supply circuits belonging to the third group in the self-refresh mode, so as to reduce the power of the power supply circuits (as shown in FIG. 7).

Referring to FIG. 1, FIG. 3 and FIG. 4, when the power control circuit 114 is operated in the low power control state and the normal power control state, the power control circuit 114 maintains the power outputs of the power supply circuits belonging to the fourth group to the active state. For example, the peripheral circuit 111b requires the voltage VINT in order to periodically send the internal self-refresh command AREF. Even under the self-refresh mode, the peripheral power supply circuit 115b should maintain the active state, so as to continuously supply the voltage VINT to the peripheral circuit 111b. On the other hand, current consumption of the voltage VBLH is very low, so that the sensing amplifier power supply circuit 115d may also be kept to the active state.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

The pSRAM and the operation method of the invention may sense the operating temperature of the pSRAM through a temperature sensor. When the pSRAM enters the self-refresh mode, the power control circuit may be selectively switched between the low power control state and the normal power control state according to the operating temperature of the pSRAM. In this way, the power of the pSRAM may be further managed in the self-refresh mode, so as to reduce the current consumption of the pSRAM in the self-refresh mode. It should be noted that in the embodiments of the invention, the pSRAM is taken as an example for description, though a Dynamic Random Access Memory (DRAM) with the self-refresh mode may also be adopted for the embodiments of the invention.

What is claimed is:
1. A dynamic random access memory, comprising:
a temperature sensor, sensing an operating temperature of the dynamic random access memory;
a dynamic memory cell array;
a control circuit, coupled to the dynamic memory cell array, and accessing and managing the dynamic memory cell array;
a plurality of power supply circuits, supplying power to the dynamic memory cell array and the control circuit; and
a power control circuit, controlling power outputs of the power supply circuits,
wherein when the dynamic random access memory enters a self-refresh mode, the power control circuit selectively switches between a low power control state and a normal power control state according to the operating temperature of the dynamic random access memory,
wherein in case that the dynamic random access memory is in the self-refresh mode, when the operating temperature of the dynamic random access memory is higher than a threshold temperature, the power control circuit is operated in the normal power control state, and when the operating temperature of the dynamic random access memory is lower than the threshold temperature, the power control circuit is operated in the low power control state.

2. The dynamic random access memory as claimed in claim 1, wherein in case that the power control circuit is operated in the low power control state, the power control circuit determines whether to leave the low power control state to enter the normal power control state according to the operating temperature of the dynamic random access memory.

3. The dynamic random access memory as claimed in claim 1, wherein in case that the power control circuit is operated in the normal power control state, the power control circuit determines whether to leave the normal power control state to enter the low power control state according to the operating temperature of the dynamic random access memory.

4. The dynamic random access memory as claimed in claim 1, wherein the power supply circuits are divided into a plurality of groups, and the groups comprise a first group, when the power control circuit is operated in the low power control state, and during an internal self-refresh command sending period, the power control circuit controls the power outputs of the power supply circuits of the first group to switch from a floating state to an active state, and when the power control circuit is operated in the low power control state, and after the internal self-refresh command sending period is ended, the power control circuit controls the power outputs of the power supply circuits of the first group to switch back from the active state to the floating state.

5. The dynamic random access memory as claimed in claim 4, wherein when the power control circuit is operated in the normal power control state, the power control circuit controls the power outputs of the power supply circuits of the first group to maintain the active state.

6. The dynamic random access memory as claimed in claim 4, wherein the groups comprise a second group, when the power control circuit is operated in the low power control state, the power control circuit controls the power outputs of the power supply circuits of the second group to switch from the active state to the floating state, and when the power control circuit is operated in the normal power control state, the power control circuit controls the power outputs of the power supply circuits of the second group to switch back from the floating state to the active state.

7. The dynamic random access memory as claimed in claim 6, wherein the groups comprise a third group, when the power control circuit is operated in the low power control state, the power control circuit controls the power outputs of the power supply circuits of the third group to clamp to a ground voltage, and when the power control circuit is operated in the normal power control state, the power control circuit controls the power outputs of the power supply circuits of the third group to restore the active state.

8. The dynamic random access memory as claimed in claim 7, wherein the groups comprise a fourth group, when the power control circuit is operated in the low power control state, the power control circuit controls the power outputs of the power supply circuits of the fourth group to maintain the active state, and when the power control circuit is operated in the normal power control state, the power control circuit controls the power outputs of the power supply circuits of the fourth group to maintain the active state.

9. The dynamic random access memory as claimed in claim 1, wherein the control circuit comprises:

an input-output circuit, configured to provide an access interface to an external device, wherein the power supply circuits comprise an input-output power supply circuit to supply power to the input-output circuit, when the power control circuit is operated in the low power control state, a power output of the input-output power supply circuit is maintained to a floating state, and when the power control circuit is operated in the normal power control state, the power output of the input-output power supply circuit is switched back from the floating state to an active state; and a peripheral circuit, coupled between the input-output circuit and the dynamic memory cell array, wherein the peripheral circuit manages the power control circuit by sending at least one internal command, the at least one internal command comprises an internal self-refresh command, a self-refresh entry command or a self-refresh exit command, the power supply circuits further comprise a peripheral power supply circuit for supplying power to the peripheral circuit, and when the power control circuit is operated in the low power control state and the normal power control state, a power output of the peripheral power supply circuit is all maintained to the active state.

10. The dynamic random access memory as claimed in claim 1, wherein the power supply circuits further comprise a first memory cell power supply circuit, a second memory cell power supply circuit, a third memory cell power supply circuit, a first sensing amplifier power supply circuit, a second sensing amplifier power supply circuit and a third sensing amplifier power supply circuit for supplying power to the dynamic memory cell array, the first memory cell power supply circuit and the third sensing amplifier power supply circuit belong to the first group;

when the power control circuit is operated in the low power control state, a power output of the first sensing amplifier power supply circuit is switched to the floating state, power outputs of the second memory cell power supply circuit and the third memory cell power supply circuit are clamped to a ground voltage, and a power output of the second sensing amplifier power supply circuit is maintained to the active state; and when the power control circuit is operated in the normal power control state, power outputs of the first sensing amplifier power supply circuit, the second sensing amplifier power supply circuit, the second memory cell power supply circuit and the third memory cell power supply circuit are restored to the active state.

* * * * *